United States Patent [19]

Green et al.

[11] 4,394,400

[45] Jul. 19, 1983

[54] METHOD AND APPARATUS FOR DEPOSITING COATINGS IN A GLOW DISCHARGE

[75] Inventors: Geoffrey W. Green, Malvern; Alan H. Lettington, Worcester, both of England

[73] Assignee: National Research Development Corporation, London, England

[21] Appl. No.: 224,825

[22] Filed: Jan. 13, 1981

[30] Foreign Application Priority Data

Jan. 16, 1980 [GB] United Kingdom ............... 8001383

[51] Int. Cl.³ .................... B05C 3/02; C23C 11/00
[52] U.S. Cl. ................................ 427/38; 118/50.1; 204/164
[58] Field of Search .................. 427/38, 39, 40; 204/164, 168, 170, 173; 118/50.1

[56] References Cited

U.S. PATENT DOCUMENTS

| | | | |
|---|---|---|---|
| 3,419,487 | 12/1968 | Robbins et al. | 427/38 |
| 3,485,666 | 12/1969 | Sterling et al. | 427/39 |
| 3,600,218 | 8/1971 | Pennebaker | 427/38 |
| 3,650,737 | 3/1972 | Maissel et al. | 427/38 |
| 3,953,619 | 4/1976 | Matsubara | 427/39 |

Primary Examiner—John H. Newsome
Attorney, Agent, or Firm—Cushman, Darby & Cushman

[57] ABSTRACT

A method and apparatus for coating substrates by glow discharge in which the generation of ions and deposition of a coating are controlled independently. A plasma is established inside a chamber by application of either RF or DC voltages to a cathode, e.g., an aluminium cathode. Above the cathode a substrate is held on a substrate holder whose temperature can be controlled independently of the plasma temperature. An electrical bias may be applied to the substrate. Ions in the plasma strike the cathode and a number leave the cathode to strike the substrate and form the required coating. The coating may be hard carbon from a hydro-carbon gas e.g. butane, or silicon from silane gas, or germanium from germane gas. The substrate may be electrically conducting or insulating.

12 Claims, 3 Drawing Figures

METHOD AND APPARATUS FOR DEPOSITING COATINGS IN A GLOW DISCHARGE

This invention concerns a method and apparatus for depositing coatings in a glow discharge plasma. Coating may be of hard carbon, silicon, germanium or other suitable materials capable of being ionised to form plasma.

Carbon coatings are useful on for example germanium lenses used in infra red thermal imagers since the carbon coatings are very hard, wear-resistant and substantially transparent to infra-red radiation. Both silicon and germanium are transparent to infra-red and are useful in various infra-red equipments.

There are a number of techniques for coating substrates. For example a substrate may be suspended above a cathode target of the coating material in a vacuum. Argon ions are caused to strike the target thereby knocking off small particles of the target material which adhere to the substrate. Such a technique is known as sputtering. Carbon can be sputtered but the coating formed is graphitic not diamond-like.

Coatings may be grown in a plasma. For example a substrate may be used as a cathode in a DC or RF excited hydrocarbon plasma. Carbon ions are attracted to strike the substrate and form a carbon layer which for appropriate temperature and pressure conditions, is diamond-like. Likewise silicon and germanium may be respectively grown from a silane and germane plasma.

Amorphous layers of silicon have been grown for use as solar cells by controlling doping impurities in the plasma. This control of doping allows p-n junctions and p-i-n junctions to be formed by deposition in a glow discharge.

Techniques for growing carbon films are described in the following articles and their associated references: Thin Solid Films, Vol. 58 (1979) 101–105, 106, 107–116, 117–120.

Techniques for growing amorphous layers of silicon and germanium by glow discharge are described in the following article and its associated references: W. E. Spear, Doped Amorphous Semiconductor, Advances in Physics 1977, Vol. 26, No. 6, 811–845.

A disadvantage with the prior art glow discharge deposition is that in order to achieve reasonable deposition rates, high potentials have to be applied or developed at the cathode, so that the substrate is subjected to high energy incident particles. This tends to affect the stress in the coating and increases the back sputtering rate. In some cases this prevents deposition of a layer at all.

In the present invention, the generation of ions and the deposition of a coating are controlled independently.

According to this invention a method of depositing carbon coatings comprises the steps of providing a plasma containing material to be deposited as a coating in a chamber having a cathode structure, arranging a substrate to be coated in the plasma at a pre-determined distance from the cathode structure, controlling the substrate temperature independently of the plasma temperature, the arrangement being such that ions in the plasma are attracted to and strike the cathode structure and a significant number leave the cathode structure and strike the substrate to form the required layer.

According to this invention, apparatus for depositing a coating on a substrate comprises a vacuum tight chamber, a pump for providing a vacuum within the chamber, means for introducing a gas within the chamber, means including a cathode structure within the chamber and means for establishing a plasma within the chamber, means for supporting a substrate a spaced distance from the cathode, means for controlling the temperature of the substrate independently of the plasma temperature, the arrangement being such that a plasma may be formed in the chamber so that ions will strike the cathode and a significant number of atoms leave the cathode to strike the substrate and form the required coating.

Additionally the method and apparatus may include a bias voltage supply to the substrate for preliminary cleaning and for use during deposition of carbon to affect an ion plating enhancement of the deposition.

The gas admitted to the chamber may be a hydrocarbon (e.g. propane, butane, etc.) to form a hard carbon coating; or silane to form a silicon coating; or germane to form a germanium coating. Additionally, a dopant in the form of phosphine or borane may be admitted together with the silane or germane.

The method and apparatus of this invention separates the generation of ions of carbon, silicon, germanium, etc and the deposition onto the substrate. Also, the substrate temperature and potential are independent of the temperature and potential involved in the generation of the ions.

The invention will now be described, by way of example only, with reference to the accompanying drawings, of which FIG. 1 is a diagrammatic view in section of apparatus for growing coatings of hard carbon, silicon, and germanium;

Figure 1:
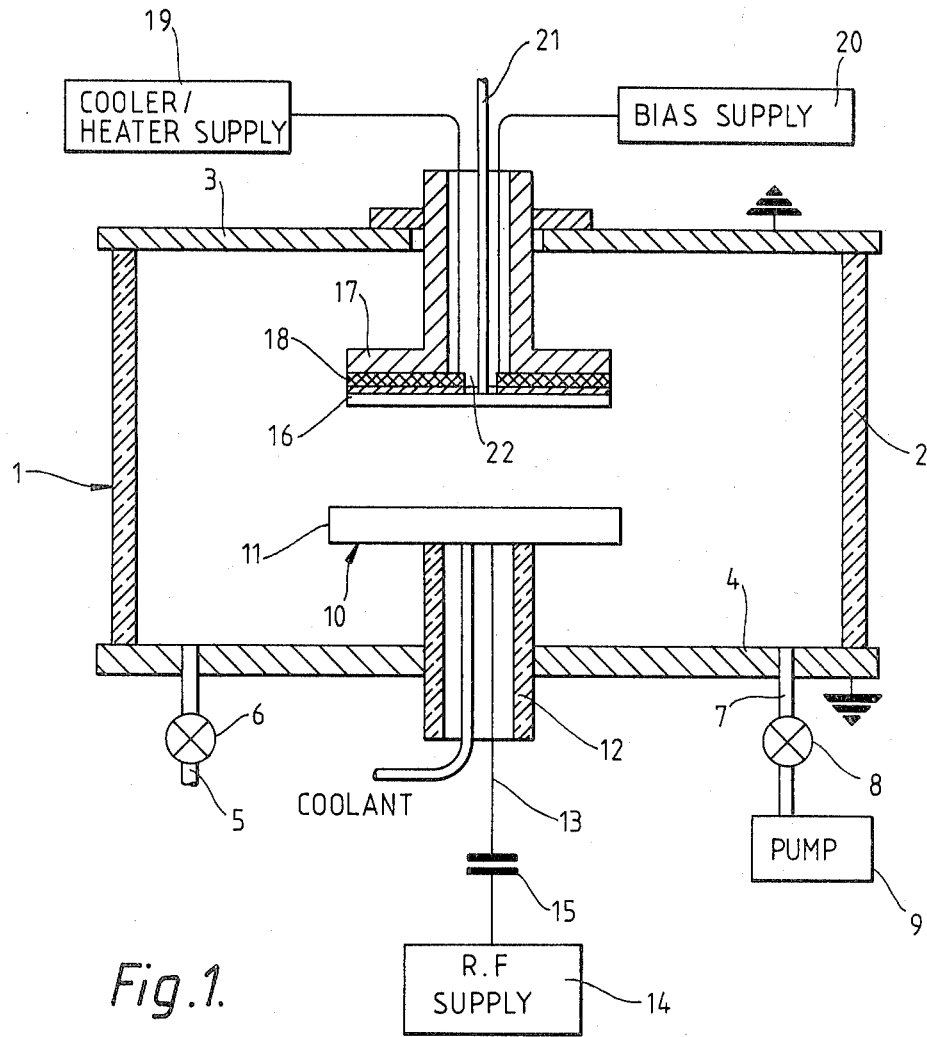

As shown in FIG. 1, a vacuum tight chamber 1 has an annular wall section 2 and top and bottom end plates 3, 4 respectively. A gas inlet pipe 5 allows gas to enter the chamber 1 through a valve 6. A gas supply (not shown) is connected to the valve 6 and may be pressurised cylinders of argon, butane, silane, germane, phosphine, or borane. A gas outlet pipe 7, valve 8 and vacuum pump 9 enable the required pressure to be maintained in the chamber 1. Inside the chamber 1 is a water cooled cathode structure 10 comprising an aluminium plate 11 spaced from the chamber bottom plate 4 by an insulator 12 which also carries an RF supply conductor 13 and cooling water to the cathode plate 11. An RF supply 14, typically 200 watts, 1,000 volts at 13 mHz feeds the cathode 10 through a 200 pF capacitor 15. The top and bottom plates 3, 4 are electrically connected together and to earth forming an anode structure, the plasma being established between the cathode and anode structure.

A substrate 16 to be coated is held in a substrate mounting 17 which is insulated from the top plate 3. The distance between the cathode plate 11 and substrate 16 is typically 7 cm. Inside the substrate mounting 17 is a heater/cooler 18 connected to a heater/cooler supply 19 outside the chamber 1. The substrate 16 may have a bias voltage applied thereto from a bias voltage supply 20. A sheathed thermocouple 21 passes inside a tube 22 in the mounting 17 to measure substrate 16 temperature.

In an alternative embodiment, the RF supply 14 is replaced by a DC supply and the capacitor 15 removed.

Operation to carbon coat a substrate of electrically conducting (e.g., resistivity 5-20 ohm-cm) doped germanium is as follows.

Figure 2:
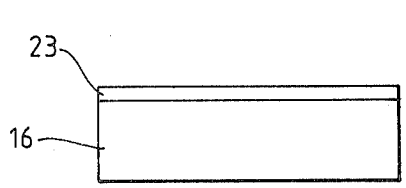
FIG. 2 is a cross section of a carbon coating on a substrate.

The substrate 16 is mounted on the mounting 17 and cleaned in the usual manner e.g., by wiping with a solvent such as alcohol. The apparatus of FIG. 2 is assembled and the chamber 1 evacuated by the pump 9 to less than $10^{-5}$ Torr. to remove contaminants.

Argon gas is admitted through the valve 6 and pipe 5 to a pressure of about $10^{-2}$ Torr. on an air calibrated gauge and the substrate 17 heated to about 200° C.

The plasma is generated in argon by energising the cathode 10 whilst a bias voltage of about $-200$ volts DC is applied to the substrate 17 from the supply 20. This provides bombardment of the substrate with argon ions, thereby cleaning the substrate surface to be coated. About 2 minutes of cleaning is adequate. The cleaning bias voltage is then removed.

The argon is then removed from the chamber 1 by the pump 9 and a hydro-carbon gas, e.g. butane, is admitted to the chamber 1 through the inlet pipe 5 to a pressure of $0.7-1 \times 10^{-2}$ Torr. on the air calibrated gauge.

A bias voltage of about $-200$ volts DC is applied to the heated substrate 16 and the RF supply 14 to the cathode 11 is switched on. Typically the RF is 1K volt at 13 MHz, and at 200 watts power. In consequence the butane gas becomes ionised; positively charged carbon ions strike the cathode 11 where some stick but most leave as neutral carbon ions and strike the substrate 16. The result of the bias voltage on the substrate is to increase bonding between substrate and carbon by the process of ion plating. After an initial amount of carbon has been deposited the bias voltage is gradually reduced to around 0 to $-200$ volts DC.

After about two hours the substrate is coated to a thickness of about 1 $\mu$m with a hard carbon coating 23 (FIG. 2). The apparatus is then switched off and allowed to cool.

If a new cathode plate 11 is to be used it is given an initial carbon coating following the above process without use of a substrate. This reduces the possibility of sputtering aluminium.

The above process of depositing hard carbon using an RF supply can also be carried out using a DC (direct current) supply. In this case the cathode supply is at about $-1$K volt.

The independent control of carbon ion generation, i.e., gas ionisation and impact on the cathode, and the control of deposition onto the substrate by substrate temperature and bias voltage allows deposition of the desired carbon form with reduced induced stress. This permits growth of thick, low strain carbon coatings.

Electrically insulating substrates may also be coated with hard carbon coatings. For example, calcium aluminate, zinc sulphide, and zinc selenide may be coated.

To coat insulating or other substrates, the process is similar except that if the film bond proves to be weak, depending upon the material, a thin bonding layer of silicon or germanium may be deposited on e.g. aluminium or stainless steel, or glass substrates prior to carbon coating.

Such bonding layers may be deposited by sputtering off a silicon or germanium target in a well known manner. Alternatively, the bonding layers may be deposited by glow discharge using a gas of silane or germane instead of butane in the illustrated apparatus. Deposition of the carbon layer follows deposition of the bonding layer. For some substrate materials, an initial bonding layer of oxide may be necessary under the silicon or germanium layer.

In all the above processes, carbon coatings may be deposited without a bias voltage on the substrate.

Figure 3:
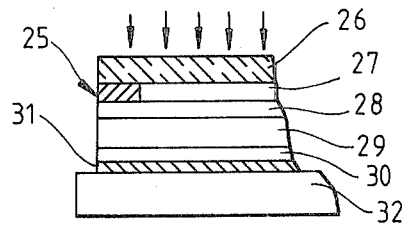
FIG. 3 is a cross section of a solar cell.

The apparatus of FIG. 1 may be used to produce photovoltaic solar cells shown in cross section in FIG. 3. The cell 25 comprises a glass front cover 26 carrying an indium tin oxide electrode structure 27 formed e.g., by vapour deposition or sputtering. A thin p type silicon layer 28 is grown from a silane or diborane glow discharge plasma. This is followed by glow discharge deposition of an undoped layer 29 of silicon (no diborane in the silane) of about 1 $\mu$m thickness, and an n type silicon layer 30 using phosphine in the silane. A thin aluminium electrode layer 31 is evaporated onto the n-type silicon and the whole assembly fixed on a support 32.

Irradiation of sunlight through the glass cover 26 produces a voltage between the electrodes 27 and 31.

An alternative construction of solar cell employs a Schottky barrier and comprises a stainless steel substrate, a highly doped n+ silicon layer, a 1 $\mu$m thick undoped silicon layer, a thin (e.g., about 50 Å thick) layer of platinum or gold, and an antireflection layer of zirconium oxide.

Other devices using p-n junction (e.g. diodes) may be constructed by deposition in the glow discharge chamber of FIG. 1.

The plasma in the chamber 1 may be excited externally e.g., by inductive coils. This is useful when the chamber 1 is constructed of an insulating material such as glass. Alternatively, two electrodes may be inserted into the chamber and used to ionise the gas.

What I claim is:

1. A method of depositing a coating on a substrate, comprising the steps of:

providing a plasma containing ions of material to be deposited as a coating in a chamber having a cathode structure, arranging the substrate in the plasma between the anode and cathode structures and electrically separated therefrom, said substrate surface being shaded from a direct stream of positively charged ions from the anode structure toward the cathode structure and spaced from the cathode structure to receive neutral ions of the coating material directly from the cathode structure, and controlling the substrate temperature independently of the plasma temperature, the arrangement being such that positively charged ions of coating material in the plasma are attracted to and strike the cathode structure and a significant number of atoms of coating material leave the cathode structure and strike the substrate to form the coating.

2. Apparatus for depositing a coating on a substrate comprising:

a vacuum tight chamber, a pump for providing a vacuum within the chamber, means for introducing a gas within the chamber, means including an anode and a cathode structure within the chamber for establishing a plasma including ions of material to be coated on said substrate within the chamber, means for supporting said substrate in the plasma between the anode and cathode structures and electrically separated therefrom said substrate surface being shaded from the direct stream of positively charged ions from the anode towards the cathode structure and spaced a predetermined distance from the cathode to receive neutral ions directly from the cathode structure means for controlling the temperature of the substrate independently of the temperature of the plasma, anode structure and cathode structure, the arrangement being such that a plasma may be formed in the chamber so that ions of the coating material will strike the cathode and a significant number of atoms leave the cathode to strike the substrate and form the required coating.

3. Apparatus according to claim 2 and further comprising means for applying a bias voltage to the substrate.

4. Apparatus according to claim 2 wherein the substate is held by a substrate mounting incorporating a substrate heater.

5. Apparatus according to claim 2 wherein the substrate is held by a substrate mounting incorporating a substrate cooler.

6. Apparatus according to claim 2 wherein the plasma is established between the cathode and an anode structure inside the chamber.

7. Apparatus according to claim 6 wherein the anode structure is a part of the chamber.

8. Apparatus according to claim 2 further including means for supplying an R.F. voltage to the cathode structure.

9. Apparatus according to claim 2 further including means for supplying a D.C. voltage to the cathode structure.

10. Apparatus according to claim 2 wherein the means for introducing a gas includes means for introducing a hydrocarbon gas.

11. Apparatus according to claim 2 wherein the means for introducing a gas includes means for introducing a silane gas.

12. Apparatus according to claim 2 wherein the means for introducing a gas includes means for introducing a germane gas.

* * * * *